(12) United States Patent
Polnyi

(10) Patent No.: US 7,414,840 B1
(45) Date of Patent: Aug. 19, 2008

(54) ELECTRICAL CONNECTOR ASSEMBLY

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/702,684

(22) Filed: Feb. 6, 2007

(51) Int. Cl.
*H05K 7/20* (2006.01)
*F28D 15/00* (2006.01)
*H01R 13/00* (2006.01)

(52) U.S. Cl. ............ 361/695; 361/715; 361/719; 165/104.33; 174/16.3; 439/485

(58) Field of Classification Search ............ 361/688, 361/690, 694–695, 715, 719, 721; 165/80.3, 165/104.33, 908; 174/16.3, 252; 439/71, 439/331, 485, 487; 454/184
See application file for complete search history.

(56) References Cited

U.S. PATENT DOCUMENTS

| | | | | |
|---|---|---|---|---|
| 5,740,014 A | * | 4/1998 | Lin | 361/697 |
| 5,794,685 A | * | 8/1998 | Dean | 165/121 |
| 5,912,800 A | * | 6/1999 | Sammakia et al. | 361/690 |
| 6,023,413 A | * | 2/2000 | Umezawa | 361/697 |
| 2002/0067596 A1 | * | 6/2002 | Searls et al. | 361/695 |
| 2007/0103868 A1 | * | 5/2007 | Yazawa | 361/699 |

* cited by examiner

*Primary Examiner*—Jayprakash N Gandhi
*Assistant Examiner*—Robert J Hoffberg
(74) *Attorney, Agent, or Firm*—Wei Te Chung

(57) ABSTRACT

An electrical connector assembly (100) comprises an insulative housing (1), a plurality terminals (100) received therein, a chip module (2) attached on the housing (1), an cover (4) mounted on the chip module (2) and a printed circuit (3) mounted below the housing (1), a heat cooling device (5) assembled through the cover (3), the chip module (2) and the housing (1), and the printed circuit board (4) for transmitting airflow into a interface formed between the housing (1) and the printed circuit board (3).

9 Claims, 11 Drawing Sheets

ELECTRICAL CONNECTOR ASSEMBLY

BACKGROUND OF THE INVENTION

1. Field of the Invention

The present invention relates to an electrical connector assembly, and more particularly to an electrical connector assembly with a self cooling system.

2. Description of the Prior Art

Land grid array (LGA) electrical connectors are widely used in the connector industry for electrically connecting LGA chips to printed circuit boards (PCBs) in personal computers (PCs). Conventionally, one kind of the LGA connector mainly comprises an insulative housing, a multiplicity of terminals received therein, The housing defines a multiplicity of terminal passageways in a rectangular array, for interferentially receiving corresponding terminals. In assembly, the terminals are inserted into the passageways of the housing. Secondly, the housing is attached on a printed circuit board. Then chip module is mounted onto the housing by manual for getting an electrical connection between conductive pads of the chip module and the terminals received in the housing. However, with the terminals of the housing increasing and the speed of the chip module received in the connector enhanced, the heat cooling ability of the connector become more and more challenge than ever.

Thus, there is a need to provide a new electrical connector assembly that overcomes the above-mentioned problems.

SUMMARY OF THE INVENTION

Accordingly, an object of the present invention is to provide an electrical connector able to reliably secure a chip module on a printed circuit board.

To fulfill the above-mentioned object, an electrical connector assembly in accordance with a preferred embodiment of the present invention comprises an insulative housing, a plurality terminals received therein, a chip module attached on the housing, an cover mounted on the chip module and an printed circuit board mounted below the housing, a heat cooling device assembled through the cover, the chip module and the housing, and the printed circuit board for providing a cooling passageway for the heat formed between the housing and the chip module. The cooling device comprises a mini-motor for providing a high-speed rotary to make air absorbing movement, a cap cover with the motor mounted thereon, and a circulating pipe for providing the high speed air passageway formed by the motor to clearance between the housing and the printed circuit board.

As an improvement of the invention, the cooling device further comprises a guiding member assembled in the circulating pipe for providing a guidance to the air flow passing through.

As an improvement of the invention, the cooling device further comprises a fastening member sandwiched between the cap cover and the circulating pipe for strengthening the engagement therebetween.

As an improvement of the invention, the connector further comprises a number of deformable pads sandwiched between the housing and the chip module for attaining a buffer arrangement.

Relative to the conventional electrical connector assembly, The electrical connector assembly in the invention can provide a placement device used for powerful cooling heat effect for the housing received the terminals and the chip module. In addition, the cooling member can provide an air guidance, which leads the air into an orderly circulation, hence strengthening the cooling effect.

Other objects, advantages and novel features of the present invention will become more apparent from the following detailed description when taken in conjunction with the accompanying drawings, in which:

DESCRIPTION OF PREFERRED EMBODIMENT OF THE INVENTION

Figure 1:
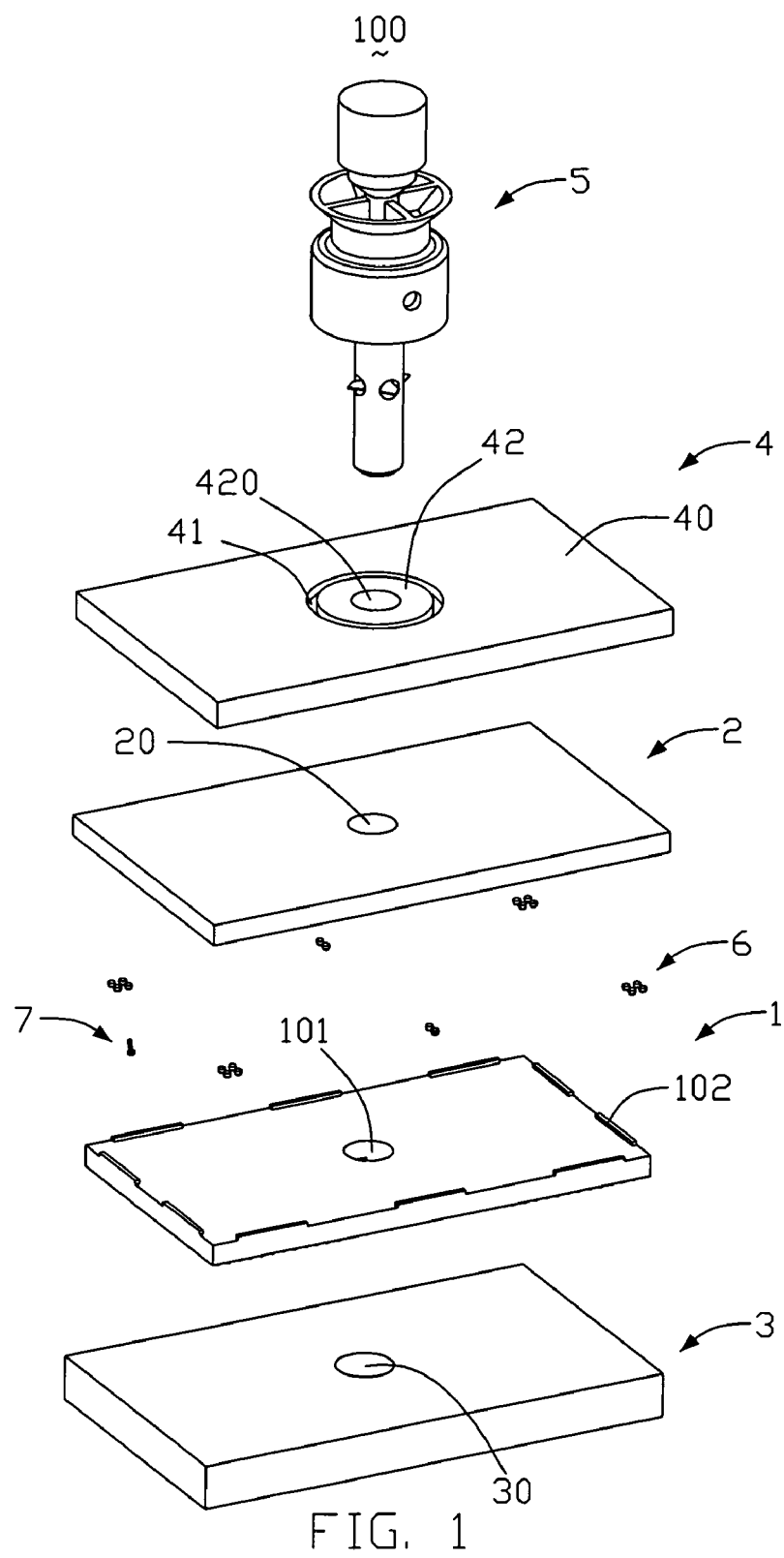
FIG. 1 is an exploded, isometric view of an electrical connector assembly in accordance with the embodiment of the present invention.

Reference will now be made to the drawings to describe the present invention in detail.

Referring to FIGS. 1-11, the electrical connector assembly in accordance with the embodiment of the invention comprises a chip module 2 with a chip hole 20 on a center portion thereof, a generally rectangular insulative housing 1 receiving the chip module 2 thereon, a multiplicity of terminals 7 received in the housing 1, a cover 4 covered on the chip module 2, a printed circuit board 3 attached below the housing 1, a cooling device 5 assembled through the cover 4, the chip module 2, the housing 1 for providing a cooling channel Should be to bring air flow to the space between seating plane and the upper surface of the housing (where contact would be exposed and the air would flow through). The housing 1, the cover 4, the chip module 2 and the printed circuit board 3 each define a hole for receiving the corresponding part of the cooling device 5 therein. The cooling device 5 comprises a mini-motor 51 for providing a high-speed rotary to make a absorb movement, a cap cover 52 with the motor 51 mounted thereon, and a circulating pipe 53 for providing the high speed air channel connecting the cap cover 52 to the connector seating plane area formed between the housing 1 and printed circuit board 3.

Figure 2:
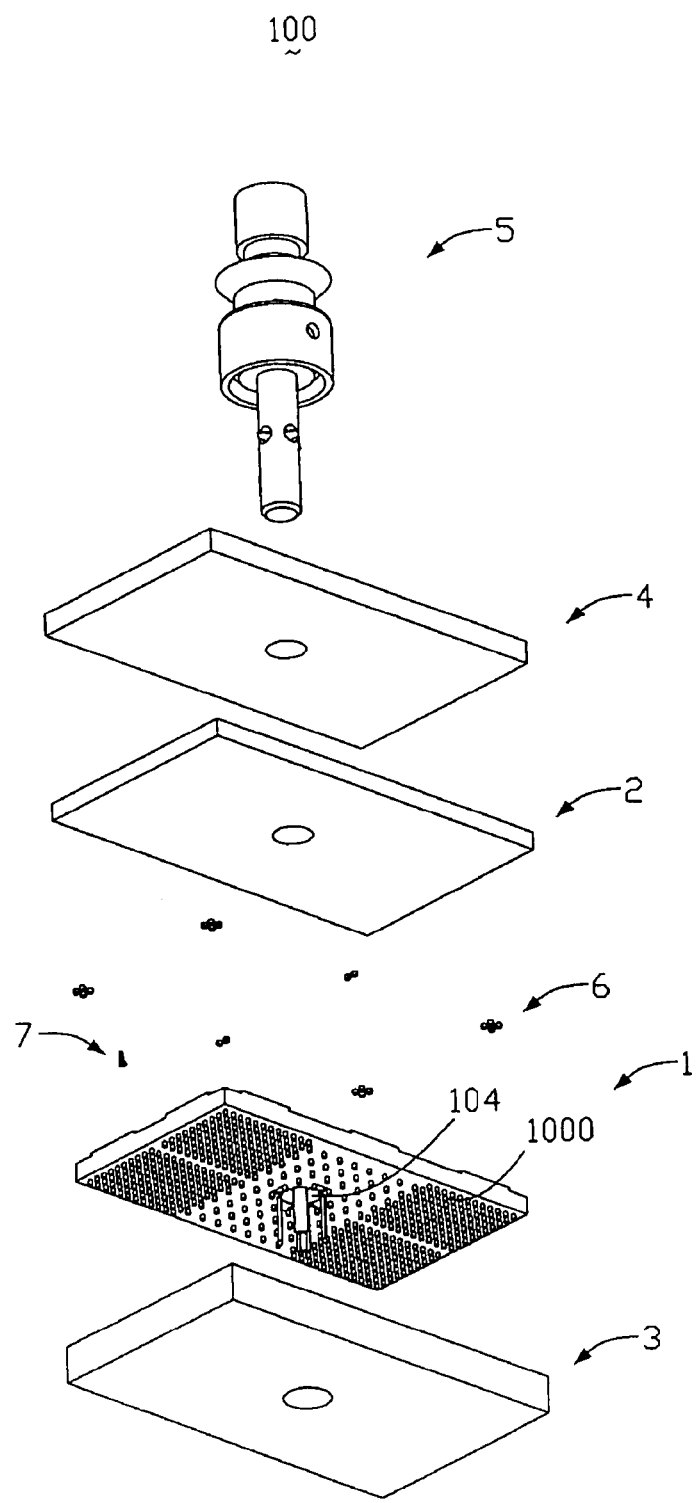
FIG. 2 is another perspective view of the electrical connector assembly shown in FIG. 1.
Figure 3:
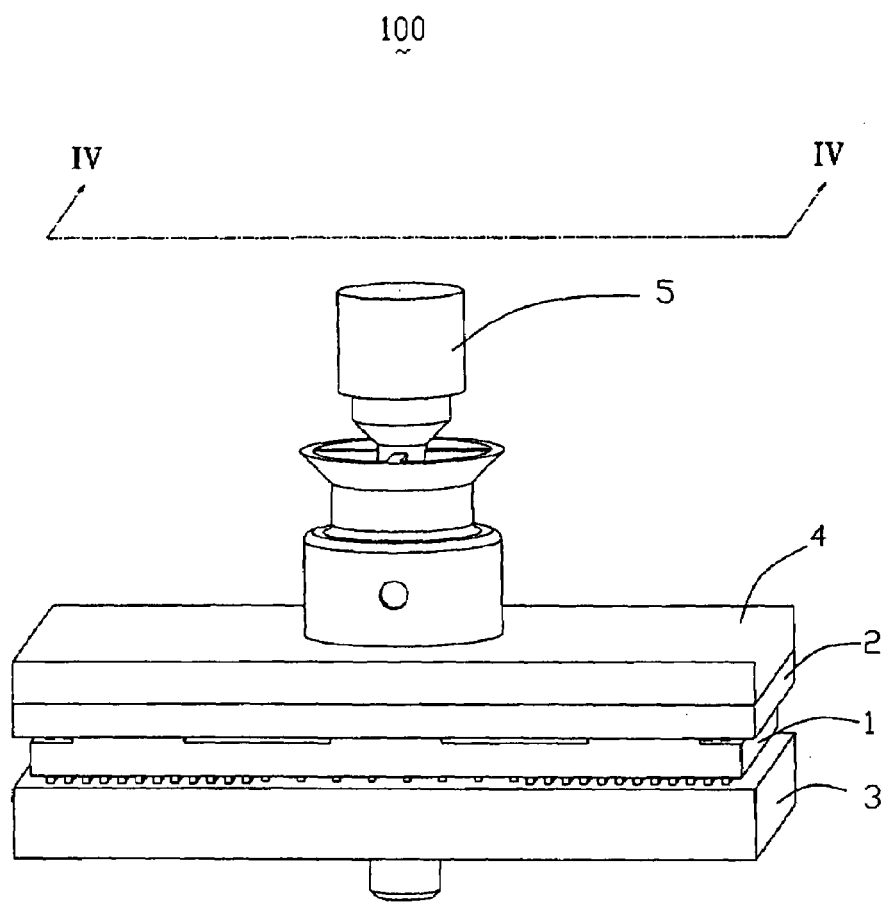
FIG. 3 is an assembled of the electrical connector assembly shown in FIG. 1.
Figure 4:
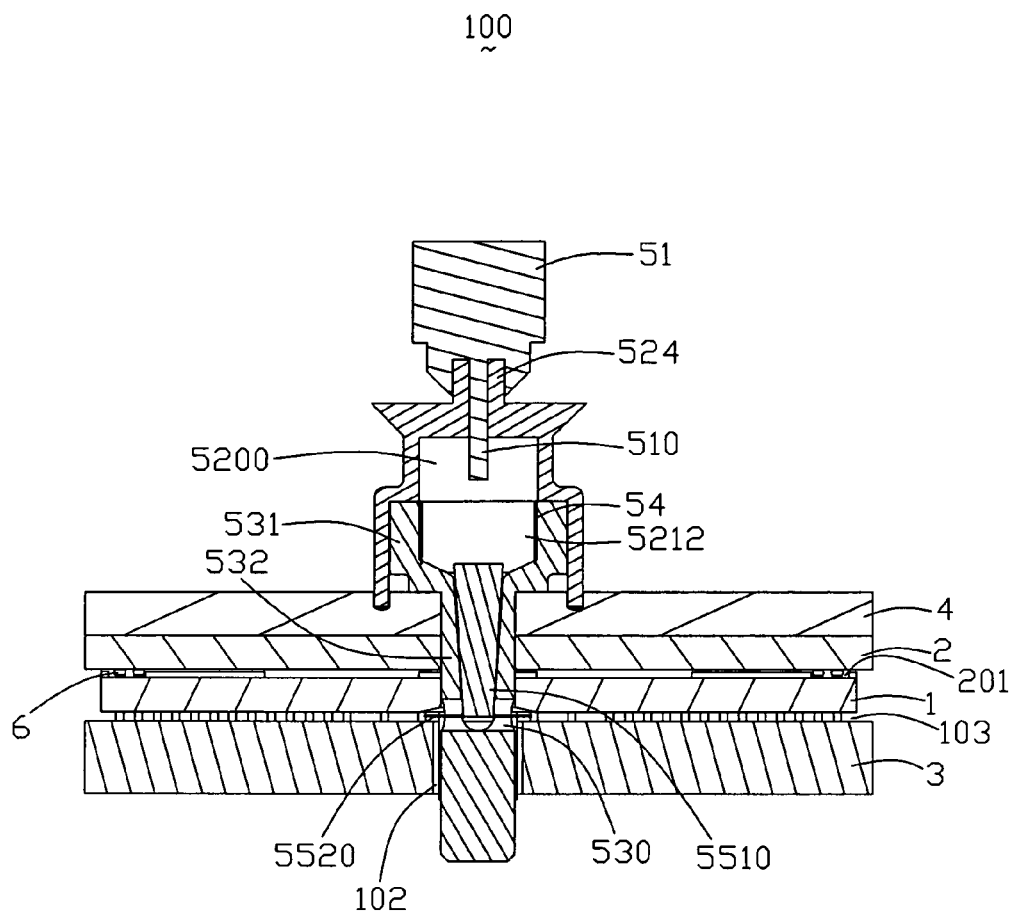
FIG. 4 is a cross-sectional view of the electrical connector assembly shown in FIG. 1, cut along the line III-III.
Figure 5:
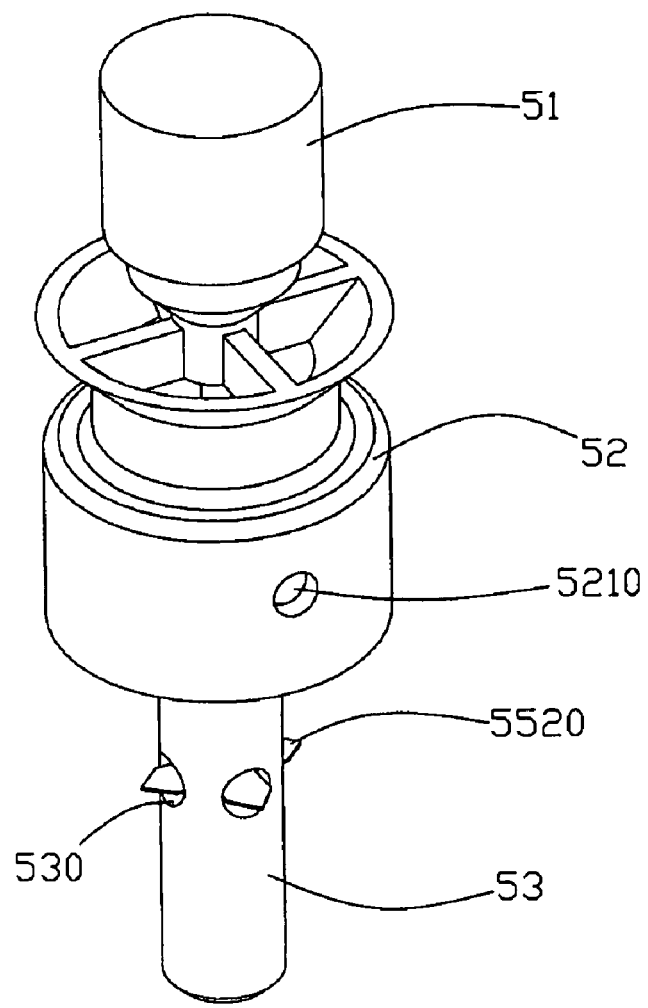
FIG. 5 is an assembled view of the cooling device shown in FIG. 1.
Figure 6:
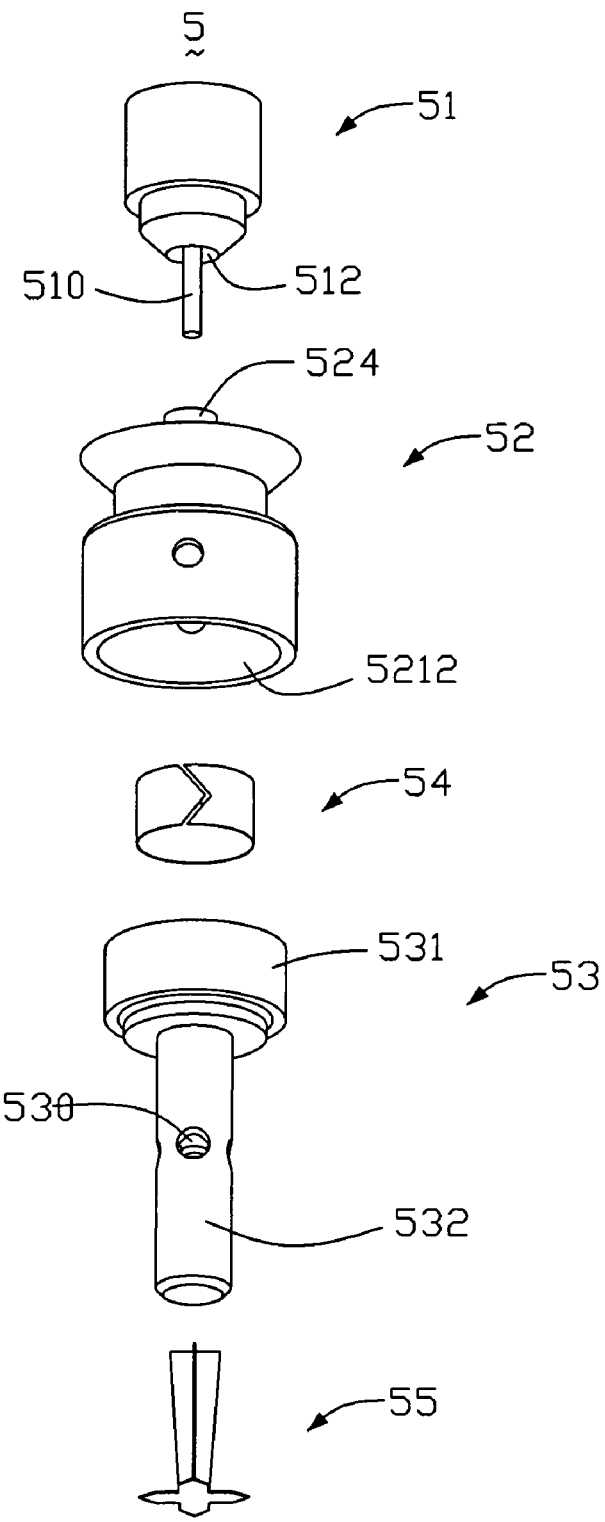
FIG. 6 is an exploded, isometric view of the cooling device shown in FIG. 5.
Figure 7:
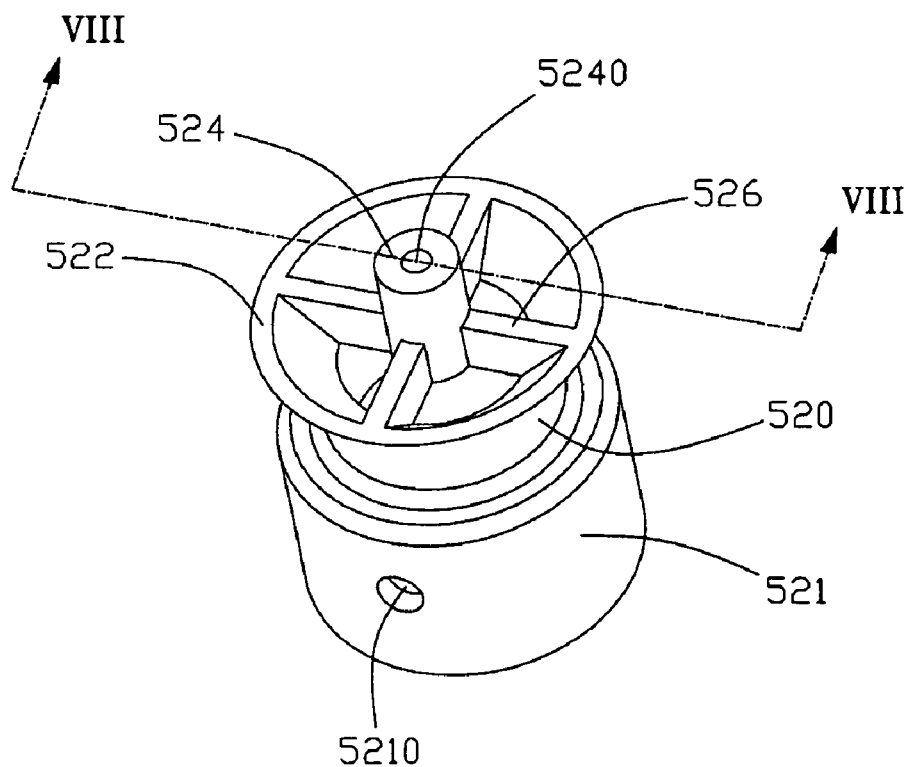
FIG. 7 is a perspective view of the cap cover shown in FIG. 6.
Figure 8:
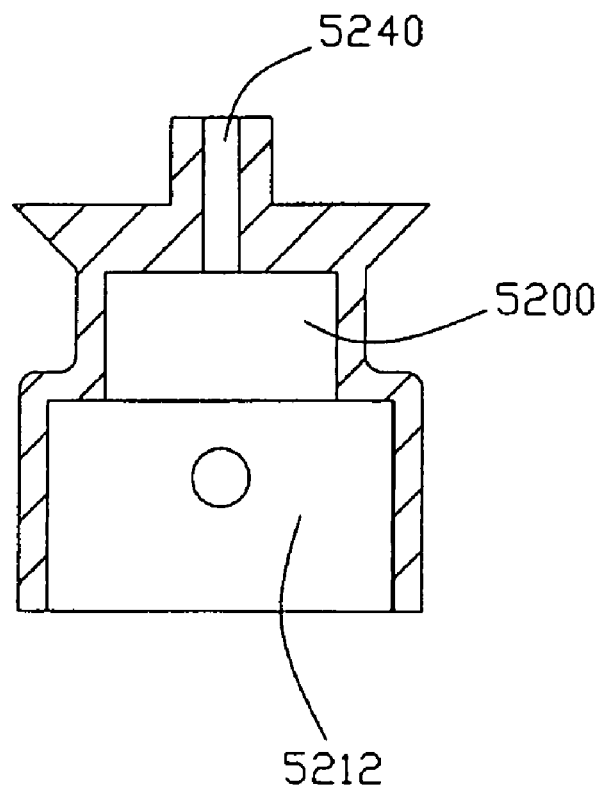
FIG. 8 is a cross-sectional view of the cap cover shown in FIG. 7, cut along the line VIII-VIII.
Figure 9:
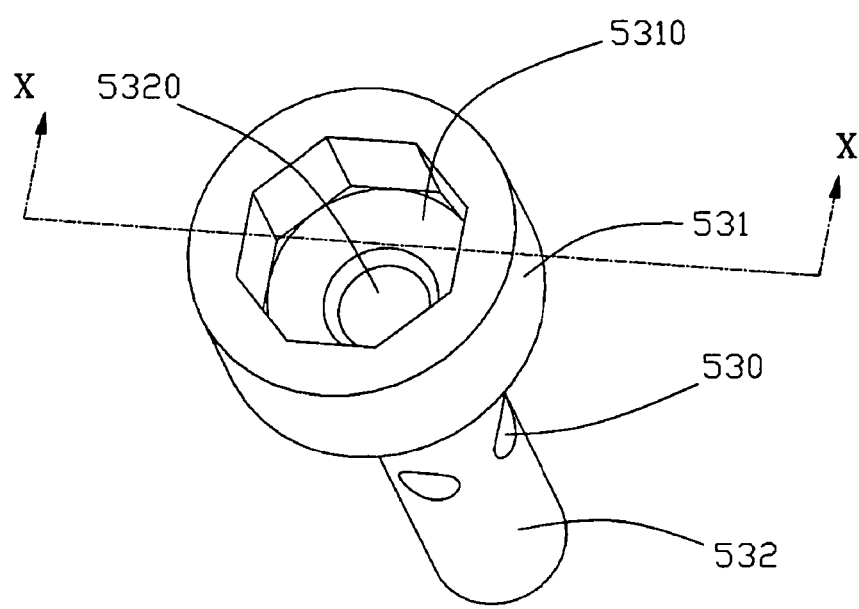
FIG. 9 is a perspective view of the circulating pipe shown in FIG. 6.
Figure 10:
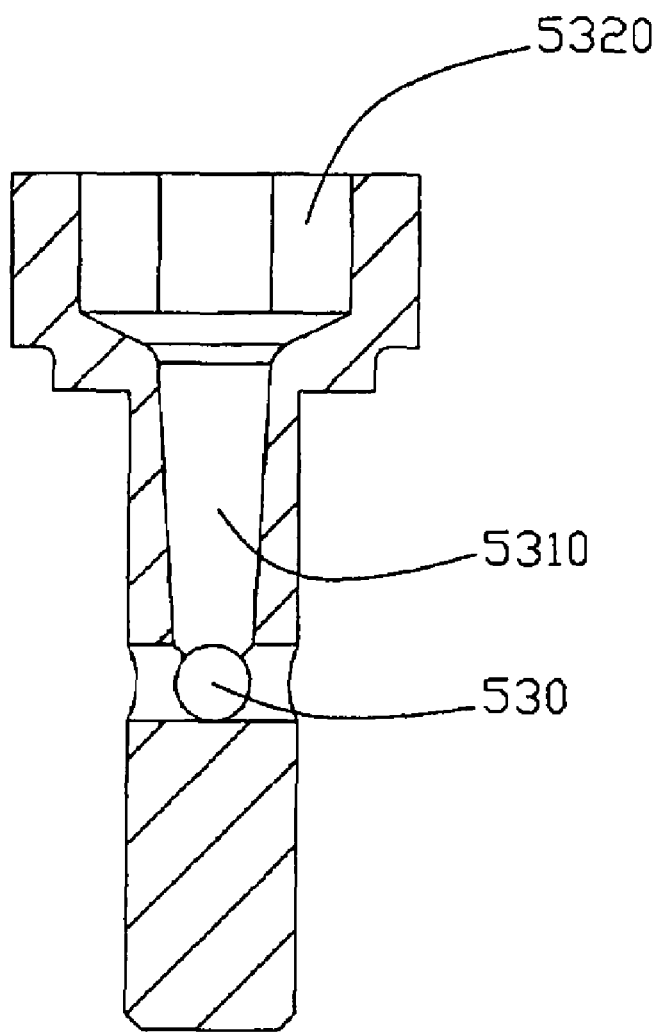
FIG. 10 is a cross-sectional view of the circulating pipe shown in FIG. 7, cut along the line VIIXI-VIIXI.
Figure 11:
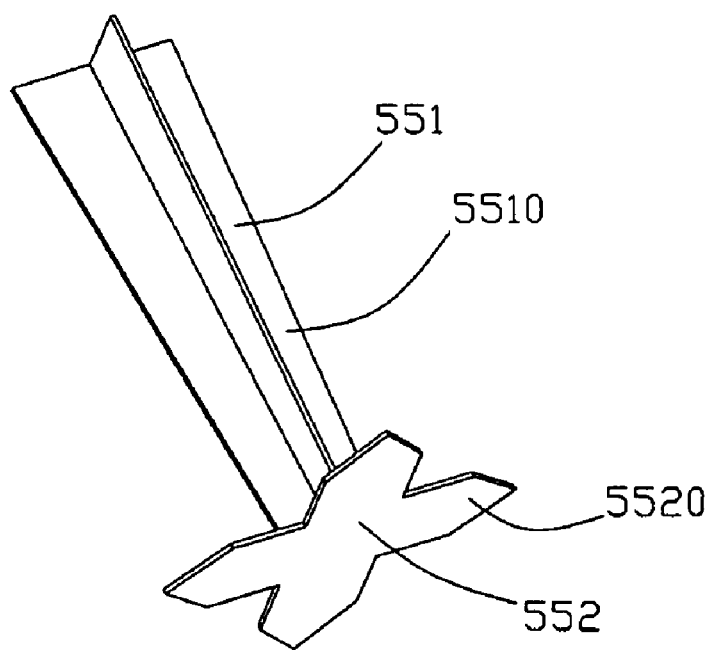
FIG. 11 is a perspective view of the guidance member shown in FIG. 6.

Referring to FIGS. 1-2, In the embodiment of the invention, the housing 1 is configured as a rectangular shape in this embodiment but it could be any shape in other cases, and comprises a number of passageways 1000 extending through the housing 1 for receiving the terminals 7 therein, a plurality of supporting member 102 extending from lateral sides of the housing 1 for providing a planar plane to the chip module 2 attached thereon, a center hole 100 defined in a central position thereof, a number of deformable members 104 extending downwardly from the sidewall around the hole 100 for getting a compliantly securing to a corresponding part of the cooling device 5.

The cover 4 is configured as a rectangular shape and comprises a body portion 40, and a projected portion 42, the projected portion 42 is separated with the body portion 40 with an arched recess 41 with the same dimension to that of the inserting portion 521 of the cap cover 5 and defines a cover hole 420 in a center portion thereof for receiving the corresponding part of the circulating pipe 53. In the embodiment, the projected portion 42 can be disposed with same height with the body portion 40 or higher than that of the portions of the cover 4.

The printed circuit board 3 comprises a base portion for supporting the housing 1 thereon and a through hole 30 for receiving the corresponding part of the circulating pipe 53.

The cooling device 5 comprises a mini-motor 51 for providing a high-speed rotary to make an air pumping movement having a slewing axis 510 and a receiving slot 512, a cap cover 52 with the motor 51 mounted thereon, and a circulating pipe 53 for providing the high speed air passageway formed by the motor 51 to the clearance between the housing 1 and printed circuit board 3. The cap cover 52 comprises a base 520 shaped into a hollowly tubbish body, an extending portion 521 extending from the base with a ring-shaped structure and forming a receiving space 5212 for receiving the corresponding part of the circuiting pipe 53, a bearing portion 522 extending from the base 520 with a V-shaped structure. The bearing portion 522 includes a main portion 523, a receiving portion 524 received in the receiving slot 510 of the motor 51 and disposed in a center thereof connecting inner side of the main portion with umbrella-like supporting members 526. The receiving portion 524 is disposed higher than the main body 523 and defines a center hole 5240 for receiving the corresponding part of the motor 51. In addition, the base 520 defines a cavity 5200 in communicating with receiving space 5212 and the extending portion defines a number vent 5210 for absorbing airflow into the cooling device 5. The circulating pipe 53 comprises an engaging body 531 having a ring-like shape and an inserting portion 532 extending from a lower plane of the engaging body 531 with a dimension thinner than that of the engaging portion 531. The engaging portion 531 defines a receiving hole 5310 for connecting with the inner hole 5200 of the base 520. The inserting portion 532 is configured as partially hollow channel 5320 and defines a number of through openings 530 corporately forming into a transmitting channel for transmitting air pumped for cooling the connector 100. It should be stated that air flow in horizontal direction should be brought to the elevation of the highest temperature rise position of the connector in each application individually. The cooling device 5 further comprises a guiding member 55 including a separating portion 551 and a diverting portion 552. The separating portion 551 defines pairs of separating members 5510 for separating the air passing through and the diverting portion 552 defines pairs of diversion blades 5520 for providing guidance to the pumped air passing through. In addition, the cooling device 5 further comprises an elastic fixing member 54 inserted into the receiving hole 5320 for forming a through pipe to transmitting the air pumped by the motor 51.

In assembly, the terminals 6 are firstly inserted into the passageways 1000 of the housing 1, then the housing 1 assembled the terminals 6 is assembled to the receiving section of an upper end of the printed circuit board 3, successively, the chip module 2 is mounted above the housing 1 with the deformable pads 7 sandwiched therebetween, and then cover 4 is covered on the chip module 2 with the cover hole 420 in alignment with the through hole 20 of the chip module 2. After the connector assembled, the cooling device 5 starts to install, firstly the guiding member 55 is inserted into the hollow channel 5320 of the inserting portion 532 of the circulating pipe 53 with the blades 5520 extending through the opening 530 thereof. Secondly the circulating pipe 53 with the guiding member 55 is inserted into the cap cover 52 with the fixing member 54 sandwiched between the engaging portion 531 and the receiving portion 5212 of the cap cover 52. Then the motor 51 is mounted on the cap cover 52 with the slewing axis 510 being inserted into receiving hole 5240 of the supporting member 524. At last, the cooling device 5 is inserted through the cover hole 420 of the cover, the chip hole of the chip module 2, the housing hole 100 of the housing 2, the through hole 30 of the printed circuit board 3 to be attached thereto, with the opening 530 inserted with the blades 550 passing through and the extending portion engaging with the arched recess 41 and the projected portion 42 received into the receiving space 5212 of the cap cover 52. At the moment, the slewing axis 510 is inserted into the cavity 5200 of the cap cover 52 and the cavity 5200, the receiving space 5212, the receiving hole 5310, the hollow channel 5320 are interpenetrated each other for providing air channel to the airflow pumped by the motor 51. When the cooling device and the connector are assembled, the airflow pumped by the motor passes through the cavity 5200, the receiving space 5212, the receiving hole 5310 into the hollow channel 5320 and separated by the separating members 5510 and the diverting portion 552 flowing from the opening of the circulating pipe into the clearance forming between the housing 1 and printed circuit board 3 to give the connector a cooling solution.

The electrical connector assemblies 100 of the invention provide cooling solution for the clearance forming between the housing 1 and the printed circuit board 3, but it is should be understand that the opening 530 can be opened in other preferred position for providing further cooling airflow, for example, the openings 530 can be defined on a position of the inserting portion 531 which are positioned a clearance formed between the housing 1 and the chip module 2 for cooling the chip module 2 and the housing 1.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising: a printed circuit board; an electrical connector mounted upon the printed circuit board with a gap defined between an upper face of the printed circuit board and a bottom face of the electrical connector; a chip seated upon the electrical connector, and a mini-motor located above the chip; wherein via assistance of said mini-motor, an airflow passage is formed from an exterior above the chip, downwardly extending through both said chip and said electrical connector and to the gap where an airflow passing through said airflow passage escapes laterally.

2. The electrical connector assembly as claimed in claim 1, further including a cover, via which said air flow passage is formed.

3. An electrical connector assembly comprising: a printed circuit board; an electrical connector mounted upon the printed circuit board with a gap defined between an upper face of the printed circuit board and a bottom face of the electrical connector; a chip seated upon the connector with a clearance defined between an upper face of the electrical connector and a bottom face of the chip; and a mini-motor located above the chip; wherein via assistance of said mini-motor, an airflow passage is formed from an exterior above the chip downwardly extending through said chip to the clearance and through said electrical connector to said gap where an airflow passing through said airflow passage escapes laterally.

4. The electrical connector assembly as claimed in claim 3, wherein the airflow passage is formed from the exterior above downwardly extending through said chip and the electrical connector to communicate with both said clearance and said gap with airflow passing through said airflow passage and escaping laterally.

5. The electrical connector assembly as claimed in claim 3, wherein said mini-motor defines an opening communicating with at least one of said clearance and the gap, and wherein the airflow passes through the opening laterally to dissipate heat formed in the clearance and the gap.

6. The electrical connector assembly as claimed in claim 3, further comprising a cover seated upon the chip, via which said airflow passage is formed.

7. The electrical connector assembly as claimed in claim 3, further comprising a circulating pipe for providing the airflow passage by the mini-motor to at least one of the clearance and the gap.

8. The electrical connector assembly as claimed in claim 4, further comprising a guiding member assembled in the circulating pipe for providing guidance to the airflow passing through.

9. The electrical connector assembly as claimed in claim 8, wherein the guiding member includes a separating portion defining pairs of separating members for separating the air passing through and a diverting portion defining pairs of diversion blades for providing guidance to the pumped air passing through.

\* \* \* \* \*